United States Patent
Dykes (10) Patent No.: US 7,920,744 B2
(45) Date of Patent: Apr. 5, 2011

(54) METHOD AND APPARATUS FOR GRAPHICAL DATA COMPRESSION

(75) Inventor: Don A. Dykes, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/876,908

(22) Filed: Sep. 7, 2010

(65) Prior Publication Data
US 2011/0002538 A1    Jan. 6, 2011

Related U.S. Application Data

(62) Division of application No. 11/206,693, filed on Aug. 18, 2005, now Pat. No. 7,817,849.

(51) Int. Cl.
*G06K 9/68* (2006.01)

(52) U.S. Cl. ........ 382/218; 382/162; 382/166; 382/167; 345/418

(58) Field of Classification Search .................. 382/162, 382/164, 166, 167, 218, 274; 375/240.01, 375/240.16; 345/418, 419, 426, 473, 587
See application file for complete search history.

(56) References Cited

U.S. PATENT DOCUMENTS

| | | | |
|---|---|---|---|
| 6,326,964 B1 * | 12/2001 | Snyder et al. | 345/419 |
| 7,630,099 B1 * | 12/2009 | Hoel | 358/1.9 |
| 2008/0152221 A1 * | 6/2008 | Kadatch | 382/166 |

* cited by examiner

*Primary Examiner* — Samir A Ahmed
*Assistant Examiner* — Ali Bayat (57) ABSTRACT

A system comprising a first computer and a second computer remotely located from the first computer and in communication with the first computer via a network. The second computer comprises an encoder module which encodes and transmits a pixel color datum to the first computer. The encoder module encodes the pixel color datum by generating a bit indicative of the number of different pixel color data encoded since a datum having a same color as the pixel color datum was last encoded.

9 Claims, 6 Drawing Sheets

| RED | GREEN | BLUE | RECENTLY USED | ACTIVE ENTRY | LRU |
|---|---|---|---|---|---|
| 15 | 15 | 15 | 0 | 1 | 0 |
| 0 | 0 | 4 | 0 | 0 | 1 |

*FIG.4b*

| RED | GREEN | BLUE | RECENTLY USED | ACTIVE ENTRY | LRU |
|---|---|---|---|---|---|
| 0 | 0 | 0 | 1 | 1 | 0 |
| 15 | 15 | 15 | 0 | 1 | 1 |

*FIG.4c*

| RED | GREEN | BLUE | RECENTLY USED | ACTIVE ENTRY | LRU |
|---|---|---|---|---|---|
| 0 | 8 | 0 | 1 | 1 | 0 |
| 0 | 0 | 0 | 1 | 1 | 1 |
| 15 | 15 | 15 | 0 | 1 | 2 |

*FIG.4d*

| RED | GREEN | BLUE | RECENTLY USED | ACTIVE ENTRY | LRU |
|---|---|---|---|---|---|
| 0 | 0 | 0 | 1 | 1 | 0 |
| 0 | 8 | 0 | 1 | 1 | 1 |
| 15 | 15 | 15 | 0 | 1 | 2 |

METHOD AND APPARATUS FOR GRAPHICAL DATA COMPRESSION

CROSS-REFERENCE TO RELATED APPLICATIONS

This application claims priority to, and is a divisional of, U.S. application Ser. No. 11/206,693, filed Aug. 18, 2005 now U.S. Pat. No. 7,817,849, entitled "Method and Apparatus for Graphical Data Compression." This application may contain subject matter related to the commonly-assigned, co-pending application entitled, "Systems and Methods of Providing Image Copy and Modify Commands to a Receiver with an Associated Display," having application Ser. No. 10/988,776, a filing date of Nov. 15, 2004, and incorporated herein by reference.

BACKGROUND

Some electronic systems enable a computer user to view on his display images that are generated on another computer remotely located from his computer. In some such systems, graphical data generated on the remotely located computer is transmitted to the user's computer, accompanied by one or more commands. The commands cause the user's computer to modify the user's display based on the graphical data. Various data compression techniques are used to enhance the transmission efficiency of the graphical data. However, many of these techniques contain inherent problems that maintain transmission efficiency at undesirably low levels.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Described herein is a graphical data compression technique that enhances transmission efficiency over that of other electronic systems. Using this technique, colors of individual pixels that together comprise the graphical data are encoded and transmitted in a bit stream. The color of a particular pixel in the bit stream is encoded using bits that indicate when a pixel of the same color last appeared in the bit stream. Further, if the particular pixel color is immediately followed by additional pixels of the same color, these additional pixels are collectively encoded using bits that indicate the quantity of these additional pixels. The compression technique also may be applied to other, non-graphical types of data (e.g., command data).

Figure 1:
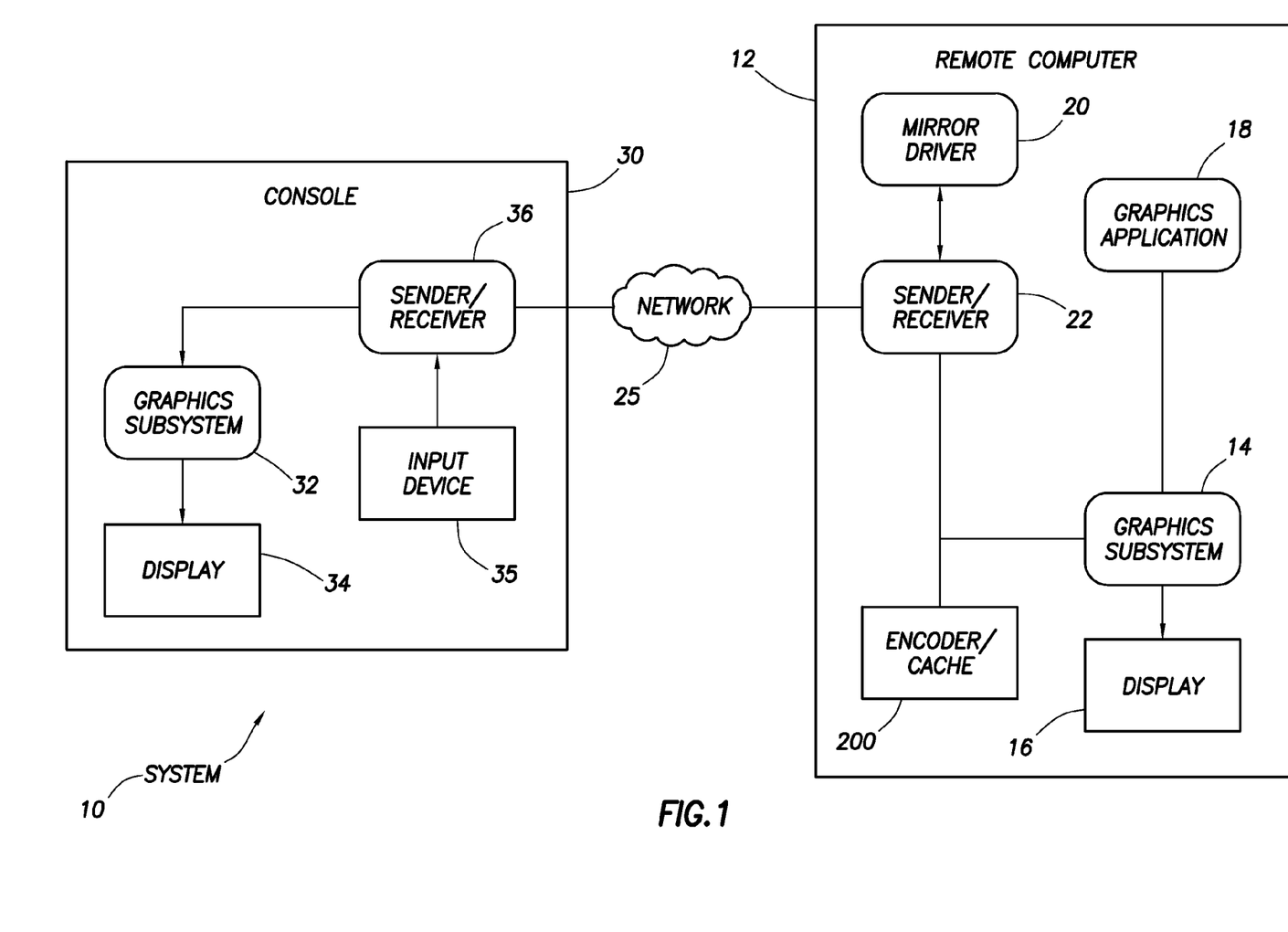
FIG. 1 shows a block diagram of a remote computer coupled to a console by way of a network, in accordance with embodiments of the invention.

FIG. 1 shows a system 10 implementing the compression technique described above. The system 10 comprises a console 30 coupled to a remotely located computer 12 (hereinafter "remote computer") by way of a network 25. The network 25 may physically or wirelessly couple the console 30 with the remote computer 12. The network 25 may comprise, for example, the Internet or some other suitable communication network (e.g., a local area network). The console 30 may be a server or any other suitable type of computer system. Similarly, the remote computer 12 may be a server or any other suitable type of computer system. The console 30 comprises an input device 35, a sender/receiver 36, a graphics subsystem 32 and a display 34. The input device 35 may be a keyboard, a mouse, or any other suitable input device. The sender/receiver 36 may be a software application that receives graphical data and command data from the remote computer 12 and transfers this data to the graphics subsystem 32. In turn, the graphics subsystem 32 uses the graphical and command data to generate or modify images on the display 34. The sender/receiver 36 also may be used to transfer data from the input device 35 to the remote computer 12, as described further below.

The remote computer 12 comprises a sender/receiver 22, a mirror driver 20, an encoder/cache 200 (e.g., encoder module), a graphics subsystem 14, a graphics application 18 and a display 16. Input data provided to the input device 35 of console 30 (e.g., by a user) is transferred to the sender/receiver 22 via the network 25. The input data is transferred from the sender/receiver 22 to the graphics application 18. In turn, the graphics subsystem 14 uses commands output from the graphics application 18 to generate or modify images on the display 16.

In operation, the remote computer 12 determines changes that occur to the images on the graphics subsystem 14 and forms "COPY" and "MODIFY" commands or other types of commands, stores such commands in a plurality of command buffers (not specifically shown), and transmits the commands from the command buffers to the console 30 when appropriate. Further information on COPY and MODIFY commands, as well as other commands that may be used to manipulate graphical data, may be obtained from the commonly-owned, co-pending application entitled, "Systems and Methods of Providing Image Copy and Modify Commands to a Receiver with an Associated Display," having an application Ser. No. 10/988,776 and a filing date of Nov. 15, 2004. The console 30 executes the commands and implements the changes defined by the commands on the display 34. Once the console 30 has executed all of the commands provided to it by the remote computer 12, the console 30 submits an Image Update Request (IUR) across the network 25 to the remote computer 12 to indicate that the console 30 is ready to process additional image update commands, if any are left to be performed. In response, the remote computer 12 may then send more COPY and MODIFY commands to the console 30. The process repeats as the console 30 implements changes to the images shown on display 34 to replicate the images generated by the remote computer's graphics subsystem 14 as shown on display 16.

The graphics application 18 running on the remote computer 12 comprises any one of a plurality of executable programs. The graphics application 18 causes images to be shown on display 16 by providing graphic commands to the graphics subsystem 14. In the embodiment illustrated, the sender/receiver 22 is a software application that runs on the remote computer's processor 40 (shown in FIG. 5 and discussed in detail below). The sender/receiver 22 receives IURs from the sender/receiver 36 over network 25. In response, the sender/receiver 22 requests regions to be modified or copied from the mirror driver 20. For those regions that are to be modified, the sender/receiver 22 obtains the pixel data associated with the images from the graphics subsystem 14. Obtaining a modify region from the graphics subsystem entails reading a graphics frame buffer in the graphics subsystem 14. A graphics frame buffer in the remote computer's graphics subsystem 14 includes pixel values that are to be applied to pixels on the display. In accordance with an embodiment of the invention, compression of pixel color information is implemented using a pixel color encoder/cache 200 that helps reduce the amount of data that needs to be transmitted from sender/receiver 22 to sender/receiver 36 as discussed in detail further below. The mirror driver 20 tracks all of the regions of the display "surface" that have been drawn on, and the type of graphics commands along with any attributes of the graphics commands that are drawn in the region. The mirror driver 20 formulates COPY and MODIFY commands and loads them into at least one command buffer for subsequent use by the sender/receiver 22.

Figure 5:
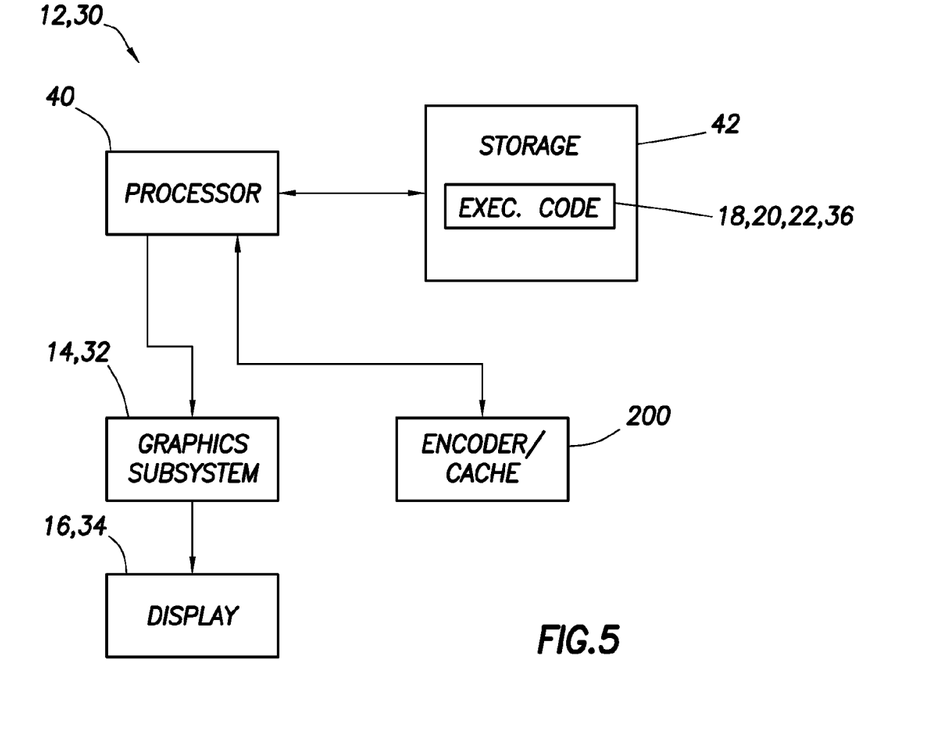
FIG. 5 shows another block diagram of the remote computer and console of FIG. 1, in accordance with embodiments of the invention.

Referring briefly to FIG. 5 in conjunction with FIG. 1, each of the remote computer 12 and console 30 comprises a processor 40, storage 42, and, as noted above, a graphics subsystem 14, 32 and a display 16, 34. Each executable code, for example the graphics application 18, mirror driver 20, the sender/receiver 22 and the sender/receiver 36 in the illustrated embodiment, are executed by the respective processor 40 in that system and are stored in storage 42. Storage 42 may comprise volatile storage such as random access memory, non-volatile storage such as a hard disk drive, or a combination thereof. Each of the graphics subsystems 14 and 32 may comprise additional executable code such as application programming interfaces (APIs), graphics drivers, and one or more hardware components such as a graphics adapter. Each graphics subsystem also includes at least one frame buffer into which pixel color values are temporarily stored to render pixels on the associated display.

Referring to FIG. 1, remote computer 12 executes the graphics application 18 that causes images such as text, lines, etc., to be shown by the graphics subsystem 14 on display 16. Via network 25, the remote computer 12 also sends image update commands to the console 30. The image update commands dictate to the console 30 how to alter the information shown on display 34 so as to replicate that which is being shown on display 16. The input device 35 permits a user of the console 30 to effectively interact with the graphics application 18 as if the graphics application were being executed on the console 30.

In accordance with an embodiment of the invention, an encoder/cache 200 as shown in FIG. 5 and located in the remote computer 12 in one embodiment, helps minimize the amount of pixel information that needs to be transmitted from the remote computer 12 to the console 30 when graphical updates occur to display 16. Although the present invention is concerned with minimizing the data sent from remote computer 12 to console 30, in other embodiments, the present invention can be used in systems requiring reduction in the amount of graphical information sent bidirectionally. Such a bidirectional system may require the use of an encoder/cache 200 on both the remote computer 12 and the console 30, as opposed to just the remote computer 12.

In accordance with embodiments of the invention, a variable width coded bit stream where the smallest width is one bit is used to provide information to the console 30 regarding changes to the graphical screen display 16, so that the console 30 may update display 34 to reflect what is displayed on display 16. For example, a particular region of the graphical screen display 16 may have been updated, and the image on the display 34 may need to be updated accordingly. To provide the console 30 with the graphical data necessary to update the display 34, the variable width bit stream is sent from the remote computer 12 to the console 30. As previously described, colors of individual pixels that together comprise the graphical data are encoded using the encoder/cache 200 and are transmitted in the bit stream. The color of a particular pixel in the bit stream is encoded using bits that indicate when a pixel of the same color last appeared in the bit stream. Further, if the particular pixel color is immediately followed by additional pixels of the same color, these additional pixels are collectively encoded using bits that indicate the quantity of these additional pixels.

Figure 2:
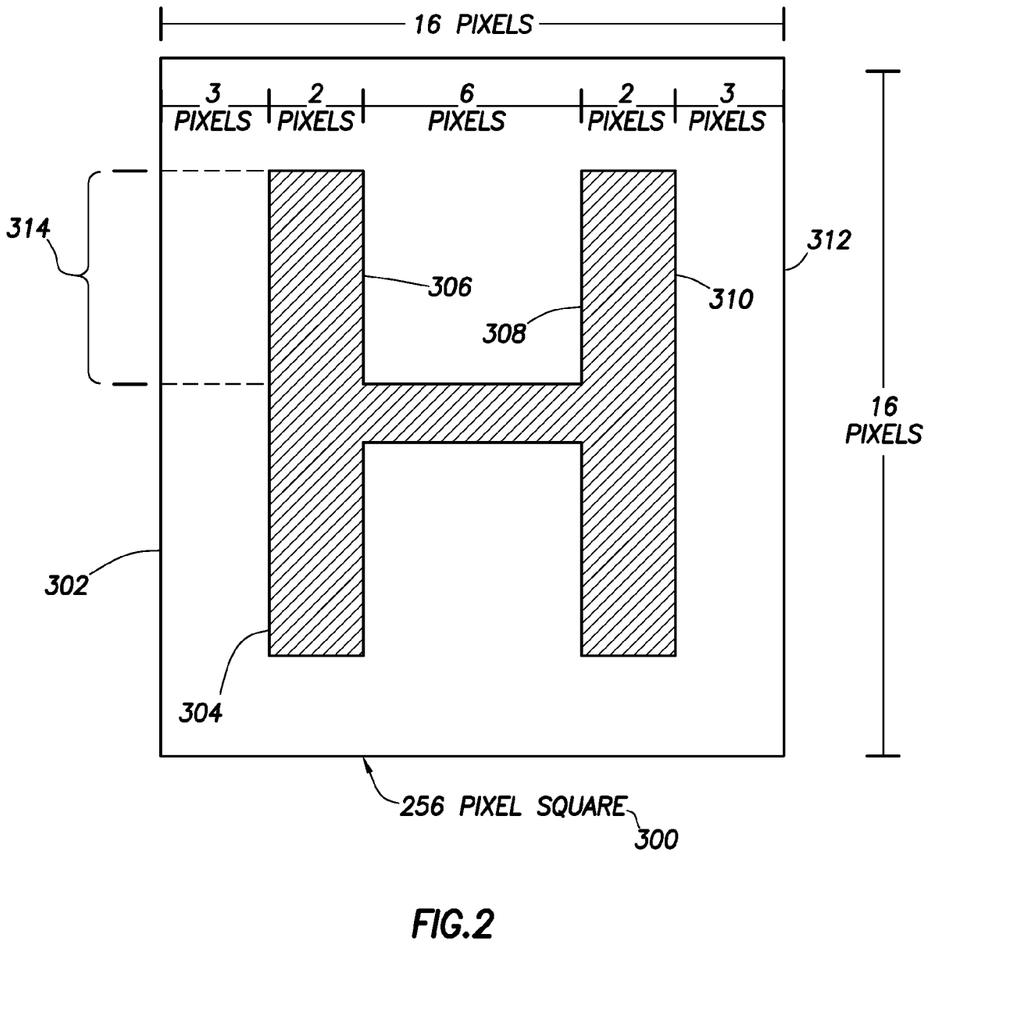
FIG. 2 shows an illustrative image that may be generated on displays coupled to the remote computer and/or console, in accordance with embodiments of the invention.

The data compression technique may be used in conjunction with a variety of commands (e.g., the MODIFY command) comprising graphical data parameters, which graphical data parameters are intended to update only a portion of the display 34. The data compression technique also may be used when transmitting streams of graphical data that are used to update some or all of the display 34. The scope of disclosure is not, however, solely limited to compression of graphical data and may be used to compress non-graphical data as well. FIG. 2 is now used to describe this graphical data compression technique in general terms. Shown in FIG. 2 is an image 300, which may be displayed on, for instance, one or both of the displays 16, 34. The image 300 is made up of multiple horizontal rows (not specifically shown). The image 300 has dimensions of 16 pixel rows by 16 pixel columns. Shown in the image 300 is a capital letter "H." Assume for purposes of explanation that the letter H is colored black, and the remainder of the image 300 (i.e., the background) is white. Further, as shown, the shortest distance from the left edge 302 of the image 300 to the left edge 304 of the letter "H" is 3 pixels. The distance from the left edge 304 of the letter "H" to an intermediate edge 306 of the letter "H" is 2 pixels. Similarly, the distance from the intermediate edge 306 to another intermediate edge 308 of the letter "H" is 6 pixels. The distance from the intermediate edge 308 to the right edge 310 of the letter "H" is 2 pixels. Finally, the distance from the right edge 310 of the letter "H" to the right edge 312 of the letter "H" is 3 pixels.

Any pixel row of the image 300 that falls into the region indicated by "314" in FIG. 2 may be encoded using the graphical data compression technique as follows: first, a color code indicating a white pixel is sent from the remote computer 12 to the console 30, followed by a code indicating that the white pixel is to be repeated 2 additional times. In this way, the console 30 produces 3 white pixels on the display 34 to represent the region between edges 302 and 304. The remote computer 12 then transmits a color code indicating a black pixel to the console 30, followed by a code indicating that the black pixel is to be repeated once. As such, the console 30 produces 2 black pixels on the display 34 to represent the region between edges 304 and 306. However, because the 6 pixels following the 2 black pixels are white, and further because white pixels already have been transmitted, the compression technique further comprises sending a code indicating the last time a white pixel appeared in the bit stream, followed by a code indicating that the white pixel is to be repeated an additional 5 times. Specifically, the code indicates that only one color (i.e., the 2 black pixels used to represent the region between edges 304 and 306) has been transmitted since the last time a white pixel was transmitted (i.e., the 3 white pixels used to represent the region between edges 302 and 304). In this way, the console 30 produces 6 white pixels on the display 34 to represent the region between edges 306 and 308. Because no code explicitly specifying a white pixel is sent, transmission efficiency is improved, since the code used to indicate the last appearance of a white pixel in the bit stream is smaller in size than a code explicitly indicating a white pixel.

Similarly, although 2 black pixels follow the 6 white pixels, because black pixels already have appeared in this bit stream, the remote computer 12 sends to the console 30 a code indicating the last time a black pixel appeared in the bit stream, followed by a code indicating that the black pixel is to be repeated an additional 1 time. In this way, the console 30 produces 2 black pixels on the display 34 to represent the region between edges 308 and 310. Because no code explicitly specifying a black pixel is sent, transmission efficiency is improved, for reasons described further below. This process continues until all the pixels in the pixel row being transmitted have been sent to the console 30. A similar process is repeated for all of the pixel rows of the image, thus generating the letter "H" on the display 34.

Figure 3:
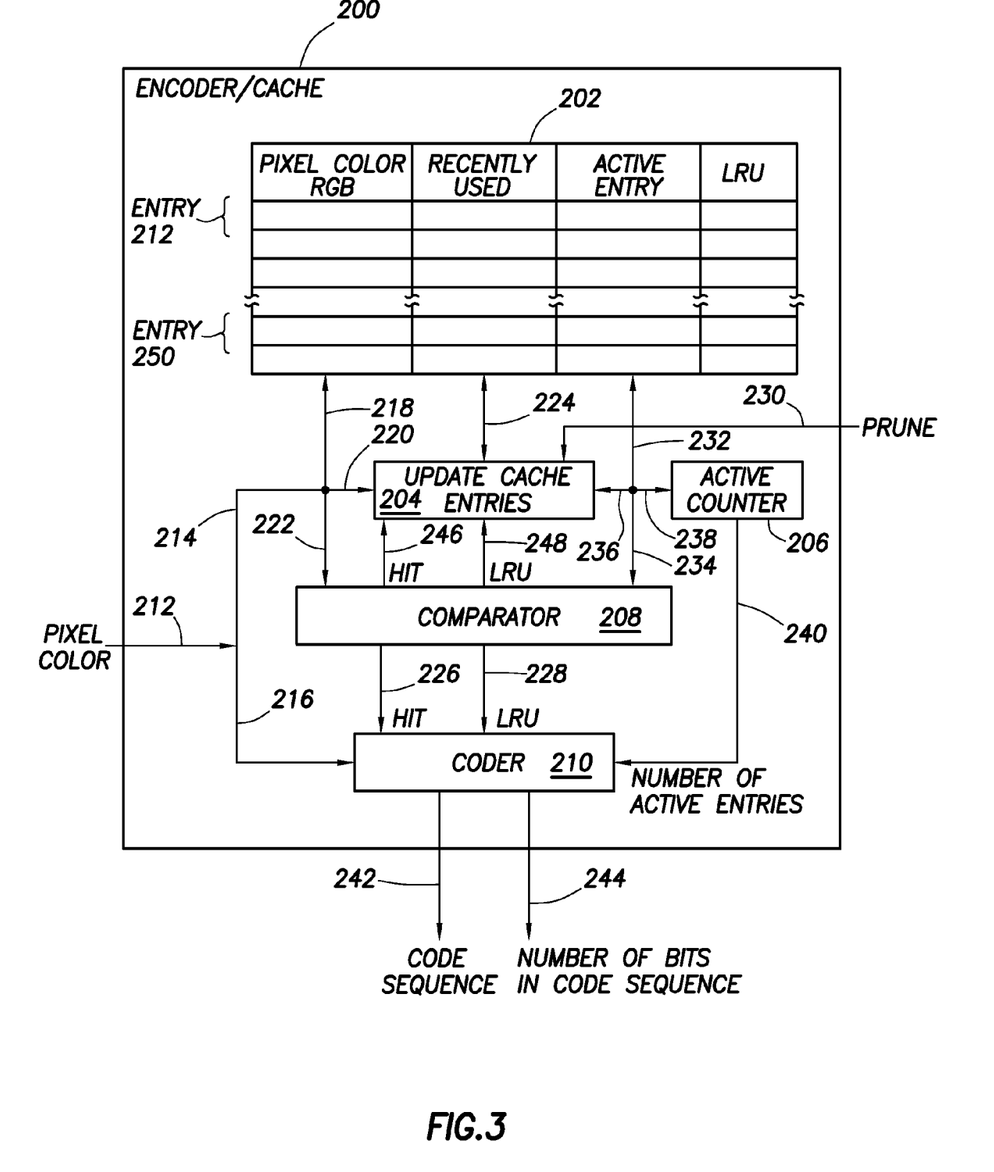
FIG. 3 shows an encoder module in the remote computer that encodes a series of bits, in accordance with embodiments of the invention.

Pixels in bit streams are encoded by the encoder/cache 200 prior to transmission from the remote computer 12 to the console 30. Pixels are encoded by the encoder/cache 200 on an individual basis but may be grouped into larger units called "blocks," as described below. Each block is a 16 pixel by 16 pixel square, thus comprising a total of 256 pixels. FIG. 3 shows the operation of the encoder/cache 200 in detail. Encoded/cache 200 comprises a cache 202, an "update cache entries" (UCE) module 204, a counter 206, a comparator module 208 and a coder module 210. The contents of the cache 202 are described first, followed by the general operation of the encoder/cache 200.

The cache 202 comprises a data structure having a plurality of entries, such as illustrative entry 212. Entry 212 may comprise four fields: a "Pixel Color RGB" field that describes pixel colors, a "Recently Used" field that describes whether the color indicated in the Pixel Color RGB field has been used within the last pixel block, an "Active Entry" field that indicates whether entry 212 is valid, and a "Least Recently Used" (LRU) field that indicates how recently the color indicated by the Pixel Color RGB field was encoded in the bit stream. In some embodiments, the LRU field of an entry may be an index field used to describe the location of the entry in relation to the other entries in the cache 202. The most recently used entry is on the "top" of the cache 202, while the least recently used entry is on the "bottom" of the cache 202. In the case shown in the figure, the entry 212 is the most recently used entry, since it is on the top of the cache 202, and thus the LRU field of the entry 212 indicates an index of "0."

The Pixel Color RGB field comprises three numbers that range from 0 to 15. One of the three numbers corresponds to "Red," while a second of the three numbers corresponds to "Green" and the third number corresponds to "Blue," thus forming the acronym "RGB." The shade of each of the three aforementioned colors is indicated by the number corresponding to that color. A variety of colors can be created by mixing different shades of the colors red, green and blue. For example, a dark shade of blue can be described with a "15," whereas a light shade of blue is described with a "0." A medium-shade of blue may be described with a "7" or an "8." Similarly, a dark shade of red can be described with a "15," and a light shade of red can be described with a "0," while a mildly light shade of red can be described with a "3."

In this way, each of the three colors can be assigned different shade numbers to produce one of 4,096 different combinations of numbers. Each combination produces a different color, or at least a different shade of a single color. For example, a combination of "0 0 0" might produce a deep black, while a combination of "15 15 15" might produce a brilliant white, both of which are obviously different colors. However, a combination of "15 14 15" still may produce white, albeit slightly darker than the combination "15 15 15." In this way, various combinations may be created to produce various colors. Accordingly, the Pixel Color RGB field is used to describe a color associated with the entry 212. For instance, if the entry 212 is associated with a very light green, then the Pixel Color RGB field for entry 212 may contain the combination "0 1 0." In at least some embodiments, each specific value from 0-15 may be represented in the Pixel Color RGB field with a 12-bit combination. For example, the combination "0 0 0" may be represented by "0000 0000 0000."

As mentioned above, in some embodiments, although pixels are steadily processed in a bit-stream, the pixels may be considered to be processed in 256-pixel blocks. Pixels are considered to be processed in 256-pixel blocks for purposes of cache 202 upkeep/maintenance. The Recently Used field indicates whether the entry 212 (i.e., the color indicated in the Pixel Color RGB field) has been used in the most recently processed 256-pixel block. If the color/entry 212 has been used in the most recent pixel block, the Recently Used field comprises a "1." Conversely, if the color/entry 212 has not been used in the most recent pixel block, the Recently Used field comprises a "0." In this way, after a complete 256-pixel block has been processed by the encoder/cache 200, entries in the cache 202 that have not been used and that may be wasting cache space can be deactivated and/or deleted by a process known as "pruning," described further below.

An entry, such as entry 212, is activated or deactivated based on the status of the Active Entry field. If the Active Entry field comprises a "1," then the entry is active (i.e., valid) and can be used by the remainder of the encoder/cache 200.

Conversely, if the Active Entry field comprises a "0," then the entry is inactive (i.e., invalid) and may not be used by the encoder/cache 200.

Referring again to all portions of the encoder/cache 200, a pixel color that is to be encoded by the encoder/cache 200 arrives in the encoder/cache 200 via connection 212 as part of a bit stream. The pixel color is routed to the UCE module 204 via connections 214, 220. The pixel also is routed to the cache 202 via connections 214, 218, and to the comparator 208 via connections 214, 222. The pixel also is routed to the coder 210 via connection 216.

Upon receiving a pixel, the comparator 208 compares the pixel color to entries in the cache 202 (described in detail further below). If the comparator 208 finds a match, or a "hit," in the cache 202, then the comparator 208 asserts the HIT connections 226, 246. The comparator 208 also sends an indication as to the location of the matching color in the cache 202 via LRU connections 228, 248. Upon receiving the HIT signal via connection 246 and the LRU signal via connection 248, the UCE module 204 updates the cache 202 via connection 224. The UCE module 204 uses the LRU signal received from the comparator 208 via connection 248 to locate the entry having a LRU field that corresponds to the LRU signal. For example, if the LRU signal received via the connection 248 indicates a location of "5," then the UCE module 204 finds an entry having an LRU index of "5" and moves this entry to the top of the cache 202.

If the comparator 208 compares the received pixel color to the cache 202 and does not find a hit (i.e., a "miss"), then the UCE module 204 inserts the received pixel color into an entry at the top of the cache 202 and pushes all of the other entries down by one index position. Because in some embodiments the cache 202 may comprise only 17 entries, the least recently used entry positioned at the bottom of the cache 202 is deleted from the cache 202 to make space for the new cache entry.

As mentioned above, the UCE module 204 receives a PRUNE signal via connection 230. One purpose of the PRUNE signal is to remove, or at least deactivate, entries in the cache 202 whose pixel colors were not used in the immediately preceding block. The PRUNE signal is asserted by some logic (not shown) on the remote computer 12 when a full pixel block (i.e., 256 pixels) has been processed by the encoder/cache 200.

When the UCE module 204 receives an asserted PRUNE signal, the UCE module 204 deactivates entries which were not used in the immediately preceding pixel block (i.e., entries having "0" values in corresponding Recently Used fields). Also in response to an asserted PRUNE signal, the UCE module 204 ensures that entries which were used in the immediately preceding pixel block (i.e., entries having "1" values in corresponding Recently Used fields) are kept active. The UCE module 204 accomplishes this by copying, for each entry in the cache 202, the value in the Recently Used field to the Active Entry field. Thus, if an entry was not used in the preceding block, then the "0" value in its Recently Used field is copied to its Active Entry field, thus deactivating the entry, or at least keeping a previously deactivated entry inactive. Similarly, if an entry was used in the preceding block, then the "1" value in its Recently Used field is copies to its Active Entry field, thus activating the entry, or at least keeping a previously active entry active. The Active Counter 206 communicates with the UCE module 204 via connections 236, 238 to keep track of the number of active entries in the cache 202. In at least some embodiments, the Active Counter 206 keeps track of the number of active entries by communicating with the cache 202 via connections 238, 232. Further, in some embodiments, if the UCE module 204 receives two consecutive assertions from the PRUNE signal, then the entries in the cache 202 are cleared and the Active Counter 206 is set to "0."

The coder 210 receives the pixel via connection 216, the HIT signal via connection 226, the location signal via connection 228, and an indication as to the number of active entries in the cache 202 via connection 240. Using this information, the coder 210 generates a bit pattern to represent the pixel color received via connection 212 (i.e., encodes the pixel color). The coder 210 can encode the pixel color using any suitable coding syntax. One such encoding syntax is now presented, followed by an example of how the encoding syntax may be implemented.

As previously mentioned, data encoded by the coder 210 is encoded in blocks. For graphical data, each block may comprise 256 pixels, although the scope of disclosure is not limited as such. Command data, which causes the console 30 to use the graphical data to generate images on the display 34, is also sent in blocks. The start of a block is marked by a single bit. A "0" bit indicates that the block is a block of pixels. A "1" bit indicates that the block is a block of commands.

In a pixel block, each of the 256 pixels is separately encoded, unless a particular pixel is repeated (i.e., is followed by additional pixels of the same color as the particular pixel). In case of repeated pixels, the particular pixel and the pixels of the same color that follow the particular pixel are encoded together into a single code. The syntax used to encode a pixel or pixels depends on a variety of factors, such as the number of entries in the cache 202, the position of the pixel color in the cache 202, the number of repeated pixels, etc. In general, a code used to represent a single pixel has the format:

[Initial pixel code] [Index] [Number of repetitions]
where the [Index] portion is optional in some cases. The [Initial pixel code] and [Index] portions of the code are generated by the coder 210 and indicate the location of a corresponding pixel in the cache 202. The [Number of repetitions] portion of the code is generated by a separate counting logic (not specifically shown) external to but associated with the encoder/cache 200. The [Number of repetitions] portions of the code indicates the number of times the pixel is to be repeated, as described in detail below.

This separate counting logic receives, via connection 212, each pixel that the encoder/cache 200 receives. The separate counting logic comprises a counter that is incremented each time a pixel is received that has the same color as an immediately preceding pixel. If a pixel is received with a different color than that of the immediately preceding pixel, then the counter is deactivated and the value of the counter is used by the logic to generate the [Number of repetitions] portions of the code. The counter then is cleared and is reactivated. The syntax of the [Number of repetitions] portion of code is described further below.

In the case that a pixel color corresponds to the second-to-top entry in the cache 202 (i.e., an entry with a LRU field value of "1"), or if there is only a single color in the cache 202, then the pixel is encoded as:

1 [Number of repetitions]
where the "1" corresponds to the [Initial pixel code], and where [Number of repetitions] is generated by the separate counting logic. The optional [Index] value is omitted. In the case that a received pixel color corresponds to the top entry in the cache 202 (i.e., an entry with a LRU field value of "0"), and if there are 2 colors in the cache 202, then the pixel is encoded as:

01 [Number of repetitions]
where the [Index] is omitted. The previous case is encoded with an Initial Pixel Code of "1," whereas the latter case is encoded with an Initial Pixel Code of "01." This is because "1" is easier to transmit than "01," and because the previous case is more common in operation than is the latter case, the "1" code is used in the previous case. The scope of disclosure, however, is not limited as such.

In the case that the cache 202 comprises 3 entries, a received pixel is encoded as:

01 n [Number of repetitions]

where "n" indicates the value of the LRU field (i.e., the index) of the corresponding cache 202 entry, and where [Number of repetitions] is generated by the separate counting logic using a syntax described further below.

In the case that the cache 202 comprises fewer than 6 entries, but more than 3 entries, a received pixel is encoded as:

01 nn [Number of repetitions]

where "nn" indicates the value of the LRU field of the corresponding cache 202 entry. In the case that the cache 202 comprises fewer than 10 entries but more than 5 entries, a received pixel is encoded as:

01 nnn [Number of repetitions]

where "nnn" indicates the value of the LRU field of the corresponding cache 202 entry. In the case that the cache 202 comprises 10 or more entries, a received pixel is encoded as:

01 nnnn [Number of repetitions]

where "nnnn" indicates the value of the LRU field of the corresponding cache 202 entry.

The values "n," "nn," "nnn," and "nnnn" above are encoded based on the LRU field of corresponding cache 202 entries. For instance, for a cache 202 comprising 17 entries, the "nnnn" value for a received pixel may be encoded according to the following scheme:

| "nnnn" value | LRU index |
| --- | --- |
| 0000 | 0 (Most recently used) |
| 0001 | 2 |
| 0010 | 3 |
| 0011 | 4 |
| 0100 | 5 |
| 0101 | 6 |
| 0110 | 7 |
| 0111 | 8 |
| 1000 | 9 |
| 1001 | 10 |
| 1010 | 11 |
| 1011 | 12 |
| 1100 | 13 |
| 1101 | 14 |
| 1110 | 15 |
| 1111 | 16 (Least recently used) |

Thus, if a received pixel value corresponds to the most recently used entry in the cache 202 (i.e., the entry with a LRU index of "0"), the received pixel is encoded as:

01 0000 [Number of repetitions]

where [Number of repetitions] is generated by the separate counting logic as described further below. Similarly, if a received pixel value corresponds to the least recently used entry in the cache 202 (i.e., the entry with LRU index of "16"), the received pixel is encoded as:

01 1111 [Number of repetitions]

In addition, the UCE module 204 shifts the entry with LRU index "16" to the top position, since this entry is the most recently used entry, and the entry is reassigned a LRU index of "0."

In the case that a received pixel value corresponds to the second-to-most recently used entry (i.e., the entry with LRU index of "1"), the received pixel is encoded as:

1 [Number of repetitions]

because, for efficiency reasons described above, there is no "nnnn" value that corresponds to an entry with LRU index "1." Similar schemes may be used to represent LRU indices for "n," "nn," and "nnn."

The above encoding examples assume that a received pixel has a matching entry (i.e., a "hit") in the cache 202. In the case of a miss, where the received pixel does not have a matching entry in the cache 202, the received pixel is encoded as follows:

000 rrrrggggbbbb [Number of repetitions]

where "000" is the [Initial Pixel Code], "rrrrggggbbbb" is a specific 12-bit combination (explained above) that produces the precise color associated with the received pixel, and [Number of repetitions] is generated by the separate counting logic, as described below. The UCE module 204 may insert a new entry in the cache 202 for the new pixel color, as previously discussed.

A special case is present when a miss occurs for a received pixel, and the received pixel has a gray-scale color. A received pixel has a gray-scale color when the shade of each component color—red, green and blue—is equal. For example, a color having a RGB combination of "5 5 5" is a gray-scale color. Similarly, a color having a RGB combination of "8 8 8" is a gray-scale color. In this special case, the received pixel is encoded as:

000 wwww [Number of repetitions]

where "000" is the [Initial pixel code] and where "wwww" is the color code for the received pixel. Although the received pixel color has three components—red, green and blue—since these three components are all the same, it is unnecessary to encode all three components. Encoding one component is sufficient. For example, if a received pixel has a RGB combination of "5 5 5," then the received pixel is encoded as:

000 0101 [Number of repetitions]

since "0101" is the binary representation for "5." The UCE module 204 also inserts a new entry at the top of the cache 202 for the received pixel.

In any case, the coder 210 encodes pixels using the techniques described above and outputs the encoded graphical data on connections 242, 244. Specifically, the coder 210 outputs the [Initial pixel code] and [Index] portions of a code on the code sequence connection 242. In some embodiments, the code sequence connection 242 comprises up to 15 physical wire connections which are used as necessary to output a particular code. Because in some cases all 15 connections will not be used, the connection 244 is used to indicate which connections are used and which are not used.

As mentioned above, the [Number of repetitions] portion of a code is generated by the separate counting module, which is not specifically shown. The separate counting module comprises a counter and has access to the stream of pixels entering the encoder/cache 200 via connection 212. each time a pixel is received that has the same color as an immediately preceding pixel. If a pixel is received with a different color than that of the immediately preceding pixel, then the counter is deactivated and the value of the counter is used by the logic to generate the [Number of repetitions] portions of the code. The counter then is cleared and is reactivated. In the case that the counter is "0" (i.e., there are no repeating pixels), the counting module generates a [Number of repetitions] code that comprises a "0." In the case that the counter is "1" (i.e., there is one repeating pixel), the counting module generates a [Number of repetitions] code that comprises a "1 0." The following table shows various numbers of repeated pixels and the corresponding [Number of repetitions] code for each:

| Number of repeated pixels | [Number of repetitions] code |
|---|---|
| 0 | 0 |
| 1 | 1 0 |
| 2 | 11 000 |
| 3 | 11 001 |
| 4 | 11 010 |
| 5 | 11 011 |
| 6 | 11 100 |
| 7 | 11 101 |
| 8 | 110 000 |
| 9 | 110 001 |
| 10 | 110 010 |
| 11 | 110 011 |
| 12 | 110 100 |
| 13 | 110 101 |
| 14 | 110 110 |
| 15 | 110 111 |

The above [Number of repetitions] codes are used for repeating pixels. In some cases, entire rows also may be repeated. In such cases, values of 1-15 are used to indicate the number of times a row that is being encoded is to be repeated. A repeat code indicates that a current pixel is repeated until the end of the row, and then the row is duplicated the number of times specified. The repeat code is as follows:

111 nnnnnnnn where "nnnnnnnn" specifies the number of times the row is to be repeated.

Figure 4A:
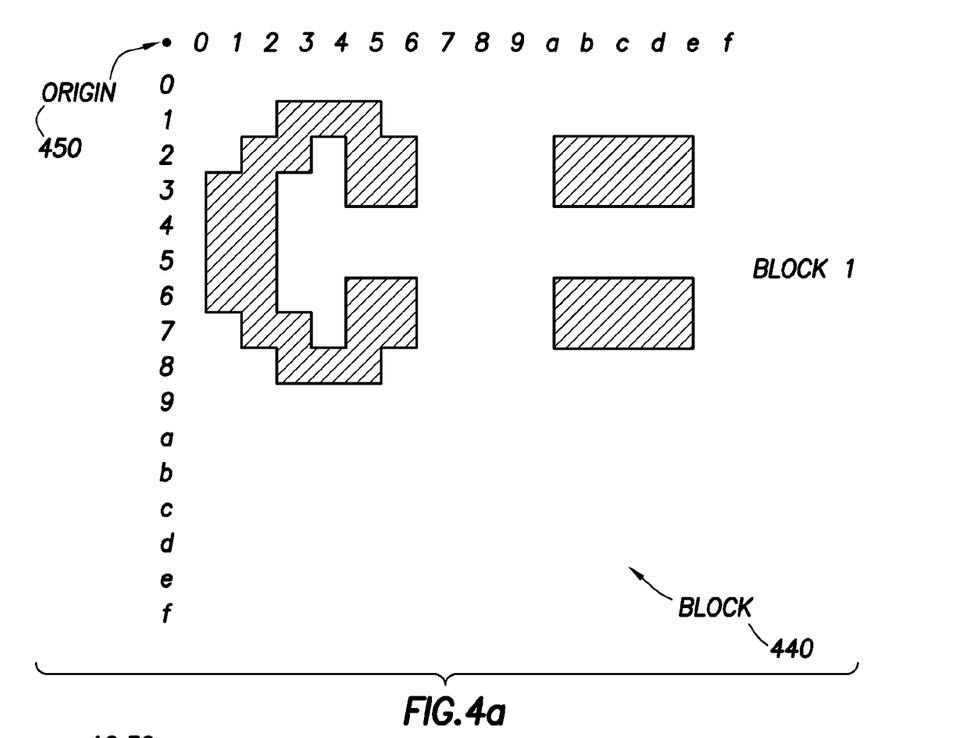
FIG. 4a shows an illustrative image that may be encoded using the encoder module of FIG. 3, in accordance with embodiments of the invention.
Figure 4B:
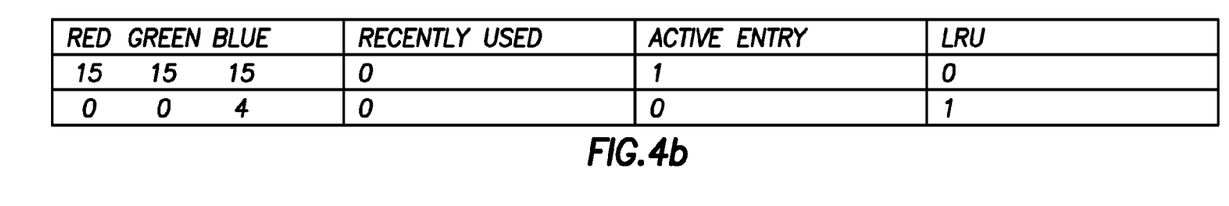
FIGS. 4b-4e show various states of a cache located in the encoder module of FIG. 3 as the encoder module encodes the image shown in FIG. 4a, in accordance with embodiments of the invention.

FIG. 4a shows an illustrative pixel block 440 that may be encoded by the encoder/cache 200. The image in the pixel block 440 comprises a black background with text superimposed on the black background. The text reads "C:" and has a green color (colors not shown). For purposes of explanation, the 256-pixel block 440 measures 16 pixels by 16 pixels. The origin is marked by indicator 450. The black background has a RGB combination of "0 0 0" and the green text has a RGB combination of "0 8 0." Shown in FIG. 4b is the cache 202 comprising arbitrarily chosen entries. Assume these entries represent the state of the cache 202 when the encoder/cache 200 begins to process the block 440. The cache 202 reflects processing a block of intense white having a RGB combination of "15 15 15." The light blue entry, "0 0 4," has been pruned from the active entries of the cache 202. Thus, there is only one active color at the time the encoder/cache 200 begins processing the block 440.

Figure 4C:
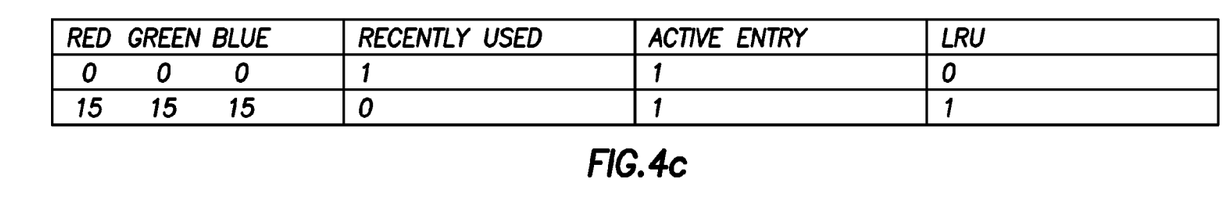

The encoder/cache 200 processes the block 440 from left to right and from top to bottom. Beginning at the upper left corner of the block 440, the pixel value received by the encoder/cache 200 is black, since the background is black (i.e., a RGB combination of "0 0 0"). The comparator 208 does not find the pixel color "0 0 0" in the cache 202. Accordingly, the UCE module 204 adds the color "0 0 0" to the cache 202, as shown in FIG. 4c. The cache 202 now contains 2 active colors. The output code sequence (i.e., [Initial pixel code] and [Index]) for this gray-scale color, which was not originally present in the cache 202, is "000 0000." As seen in block 440 in FIG. 4a, this color repeats 18 times, since there are 15 additional pixels on this row and 3 additional pixels on the next row that are black. Accordingly, the pixel repeat sequence (i.e., [Number of repetitions]) is "11 111 00010010."

Figure 4D:
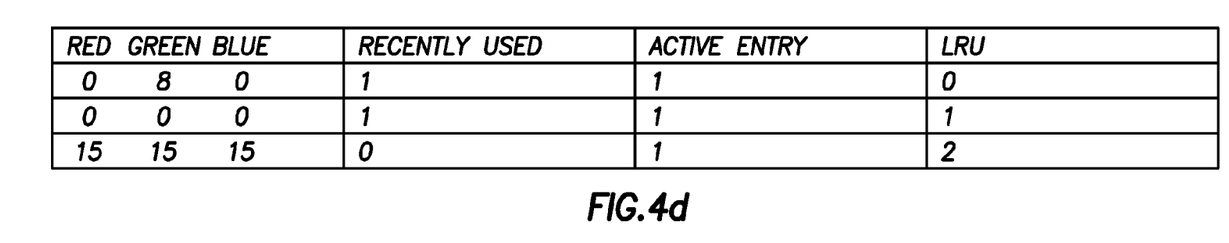

The next pixel encountered is the top portion of the "C:" green text in block 440. The green text has a RGB combination of "0 8 0," but this combination is not found by the comparator 208 in the cache 202 of FIG. 4c. Accordingly, the UCE module 204 adds the green color represented by RGB combination "0 8 0" to the cache 202, as shown in FIG. 4d. The cache 202 now comprises 3 active colors. The output code sequence for this non-gray scale color not found in the cache 202 of FIG. 4c is "001 0000 1000 0000." This pixel color is repeated three times, as seen in block 440 of FIG. 4a. Thus, the pixel repeat sequence is "11 001."

Figure 4E:
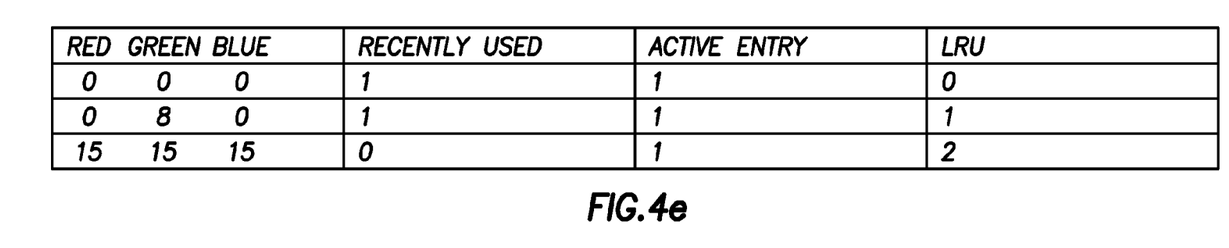

The next pixel encountered in the block 440 is in the black background. The black background, as explained above, has a RGB combination of "0 0 0." This combination is found in the cache 202 of FIG. 4d, and the corresponding LRU value is "1." Thus, the output code sequence is simply "1." Upon a cache hit, the entry of the hit is moved up to the top position in the cache 202, and all entries above the hit are moved down one position. This shifting of entry positions is reflected in FIG. 4e. This black pixel is repeated an additional 10 times on the current row and the following row, until the green "C:" text is encountered again. Accordingly, the pixel repeated sequence for these additional 10 black pixels is "11 110 010." The next pixel (at location 2, 2) is "0 8 0." This color is in the cache 202 of FIG. 4e with the LRU value of "1." The output code sequence is simply "1." The encoder/cache 200 continues in this manner until all pixels in the block 440 have been encoded.

As previously explained, both pixel blocks and command blocks may be encoded by the encoder/cache 200. When received by the console 30, command blocks contain instructions that specify how the console 30 is to use the data found in pixel blocks to generate images on the display 34. In some embodiments, a received command block contains instructions that apply to a pixel block received before the command block is received. In other embodiments, a received command block contains instructions that apply to a pixel block received after the command block is received. Command blocks may contain any of a variety of commands, such as "move" commands and "repeat" commands. Although the scope of disclosure is not limited to encoding such commands in any particular manner, in at least some embodiments, commands may be encoded using the following syntax:

| Code | Action |
|---|---|
| 000 000 | Move pixel block 1 block right |
| 000 001 | Move pixel block 2 blocks right |
| 000 010 | Move pixel block 3 blocks right |
| 000 011 | Move pixel block 4 blocks right |
| 000 100 | Move pixel block 5 blocks right |
| 000 101 | Move pixel block 6 blocks right |
| 000 110 | Move pixel block 7 blocks right |
| 000 111 | Move pixel block 8 blocks right |
| 001 xxxxxxx | Move pixel block up to 127 blocks |
| 1 xxxxxxxyyyyyyy | Move pixel block up to 127 blocks in either or both X, Y - directions |
| 01 100 xxxxxxx yyyyyyy | Set mode (x, y) |
| 01 101 | Timeout - Close frame, ignore remaining bits in current byte |
| 11 nnnnnnn | Repeat block up to 127 times |
| 01 0 | Repeat pixel block 1 time |
| 10 000 | Repeat pixel block 2 times |
| 10 001 | Repeat pixel block 3 times |
| 10 010 | Repeat pixel block 4 times |
| 10 011 | Repeat pixel block 5 times |
| 10 100 | Repeat pixel block 6 times |
| 10 101 | Repeat pixel block 7 times |
| 10 110 | Repeat pixel block 8 times |
| 10 111 | Repeat pixel block 9 times |

In this way, pixel blocks and command blocks are encoded on the remote computer 12 and are transferred to the console 30 via network 25. The console 30 receives the blocks and uses the command block to determine how to use the pixel block to generate or modify images on the display 34. Thus, an image is displayed on the display 34 that matches an image shown on the display 16.

Figure 6:
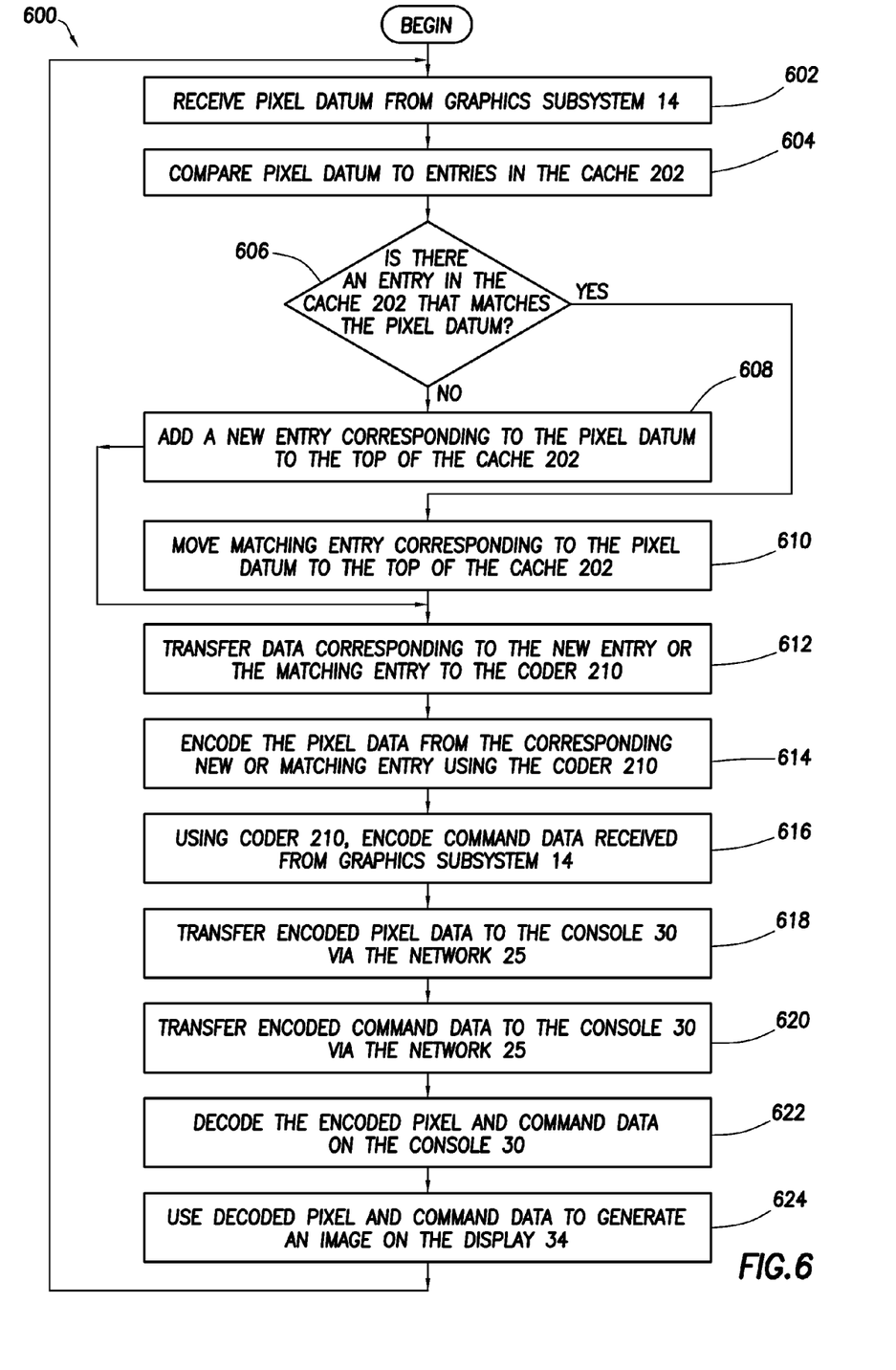
FIG. 6 shows a flow diagram in accordance with embodiments of the invention.

FIG. 6 shows a flow diagram that illustrates a process 600 that may be used to implement the above embodiments. The process 600 comprises receiving a pixel datum from the graphics subsystem 14 (block 602). Specifically, the encoder/cache 200 receives the pixel datum from the graphics subsystem 14. The process 600 then comprises comparing the pixel datum to entries in the cache 202 of the encoder/cache 200 (block 604). The process comprises determining whether an entry in the cache 202 matches the pixel datum (block 606). If no entry in the cache 202 matches the pixel datum, the process 600 comprises adding a new entry to the cache 202 that corresponds to the pixel datum (block 608). In at least some embodiments, the new entry may be added to the "top" of the cache 202, thus giving the new entry a higher priority level than the priority levels of other entries. If an entry in the cache 202 matches the pixel datum (block 606), the process 600 comprises moving the matching entry to the top of the cache 202, thus giving the matching entry the highest priority level in the cache 202 (block 610).

In any case, the process 600 further comprises transferring data corresponding to the new or matching entry to the coder 210 (block 612). The coder 210 encodes the pixel data from the corresponding new or matching entry (block 614). The process then comprises using coder 210 to encode command data received from graphics subsystem 14 (block 616). As previously described, the command data instructs the computer console 30 as to what is to be done with the graphical data transmitted immediately before or immediately after the command data. The encoded pixel data then is transferred to the console 30 via the network 25 (block 618). The process 600 also comprises transferring encoded command data to the console 30 via the network 25 (block 620). The encoded pixel and command data is then decoded on the console 30 (block 622), and the console 30 uses the decoded pixel and command data to generate an image on the display 34 (block 624). This image is identical or at least similar to the image shown on the display 16. The scope of disclosure is not limited to performing the steps of process 600 in any particular order or fashion.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
   an updateable cache;
   a comparator module coupled to the updateable cache, said comparator module adapted to receive a pixel datum, to locate an entry in the cache corresponding to the pixel datum, and to retrieve entry data from said entry; and
   a coder module coupled to the comparator module, said coder module adapted to encode said pixel datum using the entry data by generating a bit;
   wherein the bit indicates a number of different pixel color data that have been encoded since another datum was encoded, said another datum having a same color as the pixel datum.

2. The apparatus of claim 1, wherein the entry data indicates intensity levels of red, green and blue used to generate the color corresponding to the pixel datum.

3. The apparatus of claim 1, wherein the entry data indicates whether the datum having the color corresponding to the pixel datum has been encoded within a predetermined number of previously encoded pixel data.

4. The apparatus of claim 1, wherein the entry data indicates the number of different pixel data encoded since the datum having the color corresponding to the pixel datum was last encoded.

5. The apparatus of claim 1, wherein the apparatus outputs the bit via a bit stream, wherein a minimum width of the bit stream is 1 bit.

6. The apparatus of claim 1, further comprising a first computer that comprises a first display and a second computer comprises a second display, and wherein the first computer decodes the bit and uses the bit to generate on the first display an image displayed on the second display.

7. A device, comprising:
   an updateable cache comprising a plurality of entries, each entry corresponding to a different pixel color;
   means for receiving a pixel datum and comparing said pixel datum to said plurality of entries to find a matching entry; and
   means for encoding the received pixel datum by using entry data from the matching entry to generate a bit;
   wherein the bit indicates a number of different pixel color data that have been encoded since another datum was encoded, said another datum having a same color as the pixel datum.

8. The device of claim 7, wherein the means for encoding is also for generating additional bits that indicate a number of times that a corresponding pixel color is to be repeated.

9. The device of claim 7, wherein the means for encoding is also for providing a variable bit stream having a minimum width of 1 bit.

* * * * *